(12) United States Patent
La et al.

(10) Patent No.: US 6,350,627 B1
(45) Date of Patent: Feb. 26, 2002

(54) INTERLEVEL DIELECTRIC THICKNESS MONITOR FOR COMPLEX SEMICONDUCTOR CHIPS

(75) Inventors: Tho Le La; John Jianshi Wang, both of San Jose; Hao Fang, Cupertino, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/548,741

(22) Filed: Apr. 13, 2000

Related U.S. Application Data

(62) Division of application No. 08/991,299, filed on Dec. 16, 1997, now Pat. No. 6,072,191.

(51) Int. Cl.⁷ .......................... G01R 31/26; H01L 21/66; H01L 23/58
(52) U.S. Cl. .............................. 438/14; 438/692; 257/48
(58) Field of Search .................. 257/48; 438/14, 438/692, 693

(56) References Cited

U.S. PATENT DOCUMENTS

| | | | |
|---|---|---|---|
| 4,944,836 A | 7/1990 | Beyer et al. | 156/645 |
| 5,084,071 A | 1/1992 | Nenadic et al. | 51/309 |
| 5,204,835 A | 4/1993 | Eitan | 365/185 |
| 5,472,892 A | 12/1995 | Gwen et al. | 257/316 |
| 5,834,375 A | * 11/1998 | Chen | 438/692 |
| 5,835,226 A | * 11/1998 | Berman et al. | 356/382 |
| 5,903,011 A | 5/1999 | Hatanaka | 257/48 |
| 5,903,489 A | 5/1999 | Hayano | 365/51 |

\* cited by examiner

*Primary Examiner*—Olik Chaudhuri
*Assistant Examiner*—Howard Weiss
(74) *Attorney, Agent, or Firm*—Foley & Lardner

(57) ABSTRACT

A method of measuring the thickness of a dielectric layer above a plurality of structures of differing types within a semiconductor chip. The method comprises the steps of: forming a plurality of monitor boxes on a semiconductor chip such that each of said plurality of monitor boxes represents a structure type within the semiconductor chip and has substantially the same step height as one of a plurality of differing structure types; forming a dielectric layer over the semiconductor chip; and measuring a thickness of the dielectric layer above at least one of the plurality of monitor boxes, wherein said thickness represents a thickness of the dielectric layer above a structure of the structure type represented by the monitor box.

Also disclosed is a semiconductor chip that allows for accurate dielectric thickness measurements. The chip comprises: a plurality of structures of differing types located on a surface within the semiconductor chip; and a plurality of monitor boxes, located on said surface within the semiconductor chip, upon which measurements of dielectric thickness can be made, wherein each of the plurality of monitor boxes represents a structure type within the semiconductor chip.

7 Claims, 5 Drawing Sheets

INTERLEVEL DIELECTRIC THICKNESS MONITOR FOR COMPLEX SEMICONDUCTOR CHIPS

This application is a Divisional of application Ser. No. 08/991,299, filed Dec. 16, 1997, now U.S. Pat. No. 6,072,191.

BACKGROUND OF THE INVENTION

The invention relates to the measurement of the thickness of an interlevel dielectric within semiconductor chips. Specifically, the invention involves a method and apparatus for accurately measuring the interlevel dielectric thickness, after chemical-mechanical planarization, above a plurality of structures within a complex semiconductor chip, such as a non-volatile memory chip.

In the fabrication of semiconductor chips today, it is important that insulating layers have a smooth surface topography. For example, having a smooth surface topography provides increased resolution and relieves depth of focus constraints in photolithography. Planarized surfaces on dielectric layers are often obtained using a process known as chemical-mechanical planarization (CMP). This process planarizes a dielectric layer formed, for example, over gate structures in a semiconductor chip thus facilitating easier fabrication.

In addition to controlling the smoothness or degree of planarization of the dielectric layer, it is often imperative that the thickness of an interlevel dielectric formed over gate structures also be strictly controlled. The thickness of the dielectric layer above chip components such as gate structures can have a direct effect on performance, especially in multi-level chips. If the dielectric layer, after chemical-mechanical planarization, is too thin, the electrical characteristic of the underlying structures is altered. If the layer is too thick, it will adversely affect the successful performance of subsequent process steps, such as contact hole etching. Also, the tolerances defining acceptable dielectric layer thicknesses are often very strict.

One technique for measuring post-chemical-mechanical planarization thickness of an interlevel dielectric appears to provide acceptable results when used with relatively simple semiconductor chips. Such chips tend to comprise either only one type of structure or multiple, but very similar, types of structures. Typically, a monitor box is formed directly on the chip at the same time and by the same process as the other structures on the chip. Thus, the monitor box represents a structure of the type used in the chip in both height and material constitution. The monitor box provides a location on which measurements of the thickness of a subsequently formed and planarized dielectric layer can be made.

SUMMARY OF THE INVENTION

The present invention provides a method and apparatus for accurately measuring the interlevel dielectric thickness, after chemical-mechanical planarization, above a plurality of structures within a complex semiconductor chip. The existing technique as described above has been found, by the inventors, to be imprecise when applied to the fabrication of complex semiconductor chips. Complex chips contain a plurality of differing structure types. These structure types are subjected to different process steps and thus, tend to have different heights and constitutions. An example of such a complex chip is a nonvolatile memory, such as an erasable programmable read-only memory (EPROM) or a non-volatile random access memory (NVRAM), which has a single polysilicon structure in its periphery area and a dual polysilicon structure in its core area.

The inventors have found that due, in part, to the large differences between the structures within these complex chips, the dielectric layer formed over such structures tends to have not insubstantial variations in thickness. Such variations render the post-CMP dielectric thickness measurement technique described above imprecise and prone to providing incomplete or misleading information on which the determination of chip acceptability is often based. The technique of the present invention overcomes the above identified problem associated with complex semiconductor chips.

Disclosed herein is a method of measuring the thickness of a dielectric layer above a plurality of structures of differing types within a semiconductor chip. The method comprises the steps of: forming a plurality of monitor boxes on a semiconductor chip such that each of said plurality of monitor boxes represents a structure type within the semiconductor chip and has substantially the same step height as one of a plurality of differing structure types; forming a dielectric layer over the semiconductor chip; and measuring a thickness of the dielectric layer above at least one of said plurality of monitor boxes, wherein the thickness represents a thickness of the dielectric layer above a structure of the structure type represented by the monitor box.

In the method of the present invention, the step of forming a plurality of monitor boxes can also comprise forming each of the plurality of monitor boxes by using substantially the same process as used in forming the structure type represented by the monitor box. Also, the step of forming a dielectric layer can comprise the step of performing chemical-mechanical planarization of the dielectric layer. Furthermore, the method of the present invention can include the step of locating at least one of said plurality of monitor boxes in a scribe line area of the semiconductor chip or in proximity to a structure of the structure type represented by the monitor box.

Also disclosed herein is a semiconductor chip that allows for accurate dielectric thickness measurements. The chip comprises: a plurality of structures of differing types located on a surface within the semiconductor chip; and a plurality of monitor boxes, located on the surface within the semiconductor chip, upon which measurements of dielectric thickness can be made, wherein each of the plurality of monitor boxes represents a structure type within the semiconductor chip.

Further disclosed is a non-volatile memory semiconductor chip that allows for accurate dielectric thickness measurements. The chip comprises: a core area comprising at least one first structure type; a periphery area comprising at least one second structure type; a core area monitor box, upon which measurements of dielectric thickness can be made, having substantially the same layers and substantially the same step height as the first structure type; and a periphery area monitor box, upon which measurements of dielectric thickness can be made, having substantially the same layers and substantially the same step height as the second structure type.

Other features and advantages of the present invention will become apparent to those skilled in the art from the following detailed description. It should be understood, however, that the detailed description and specific examples, while indicating preferred embodiments of the present invention, are given by way of illustration and not limitation. Many changes and modifications within the scope of the present invention may be made without departing from the spirit thereof, and the invention includes all such modifications.

BRIEF DESCRIPTION OF THE DRAWINGS

The present invention will be described below with reference to the accompanying drawings, wherein.

DETAILED DESCRIPTION OF THE PREFERRED EMBODIMENTS

As described herein with reference to the accompanying drawings, the present invention provides a method and apparatus for accurately measuring the interlevel dielectric thickness, both before and after chemical-mechanical planarization, above a plurality of structures within a complex semiconductor chip. The present invention overcomes the above identified problems associated with taking accurate measurements on such chips. It should be noted that the referenced drawings are illustrative in nature and are not drawn to scale.

A complex semiconductor chip, as defined by the inventors, is one that has a plurality of different types of structures. An example of a chip of this type is a non-volatile memory, such as an erasable programmable read-only memory (EPROM) or a non-volatile random access memory (NVRAM). Chips of this type can contain both single poly-silicon structures and dual-polysilicon structures. The extent of the relative differences between the types of structures within the chip, for example in height and in composition, can be substantial.

Figure 1:
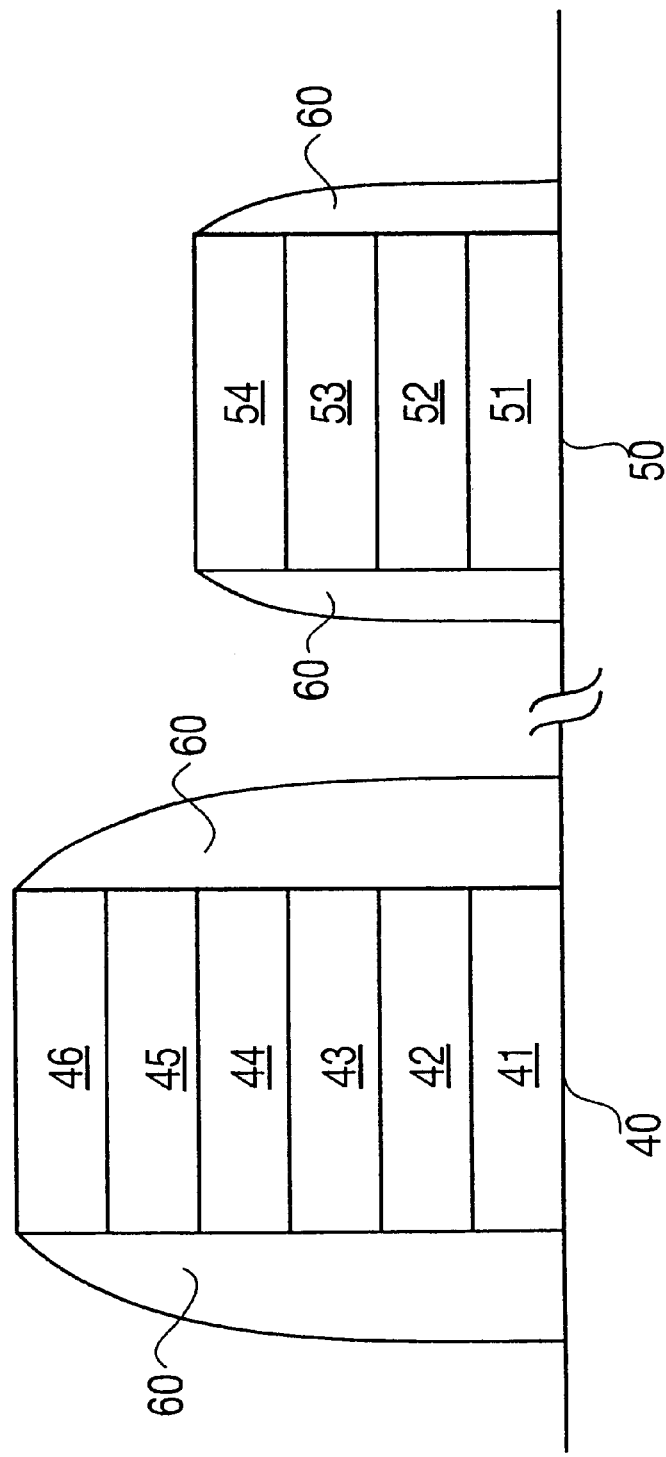
FIG. 1 is a cross sectional view of portions of a complex semiconductor chip showing the typical structure of a core area and the typical structure of a periphery area.

FIG. 1 shows a cross-sectional view of two different structures present in a non-volatile memory chip. One structure 40 is located in a core area of the chip. The other structure 50 is located in a periphery area of the chip. By way of example and not limitation, the structures shown in FIG. 1 and subsequently in FIGS. 2 and 3, relate to gate structures. It would be apparent to one of ordinary skill in the art that the present invention as described herein is applicable to other types of structures as well.

The core area gate structure 40 comprises the following layers: a tunnel oxide layer 41, a first core polysilicon layer 42 above the tunnel oxide layer 41, a silicon oxide-silicon nitride composite (ONO) layer 43 above the first polysilicon layer 42, a second core polysilicon layer 44 above the ONO layer 43, a core metal silicide layer 45 above the second polysilicon layer 44 and a core polysilicon cap 46 above the metal silicide layer 45. Also shown are spacer oxides 60 adjacent to the core area gate structure.

The individual layers and the structure 40 shown can be formed using any number of techniques well known in the art. The specific technique used is not relevant for understanding this invention. Also, knowledge of the individual layer thicknesses is not necessary for the purposes of this disclosure. However, it is important to note that the total height of the core area gate structure 40 and the layers used in its formation are different than that of the periphery area gate structure 50. It is these differences that ultimately necessitates the use of the present invention.

The periphery area gate structure comprises the following layers: a gate oxide layer 51, a periphery polysilicon layer 52 above the gate oxide layer 51, a periphery metal silicide layer 53 above the periphery polysilicon layer 52 and a periphery polysilicon cap 54 above the periphery metal silicide layer 53. Also shown are spacer oxides 60 adjacent to the periphery area gate structure.

Figure 5:
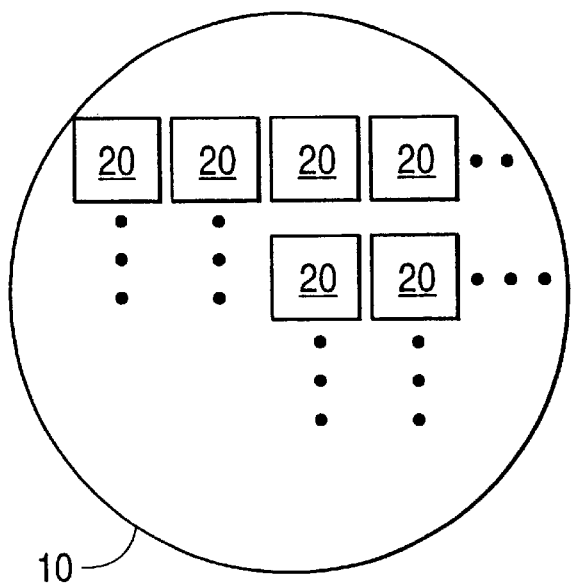
FIG. 5 is a top view of a wafer and multiple chips on the wafer.
Figure 6:
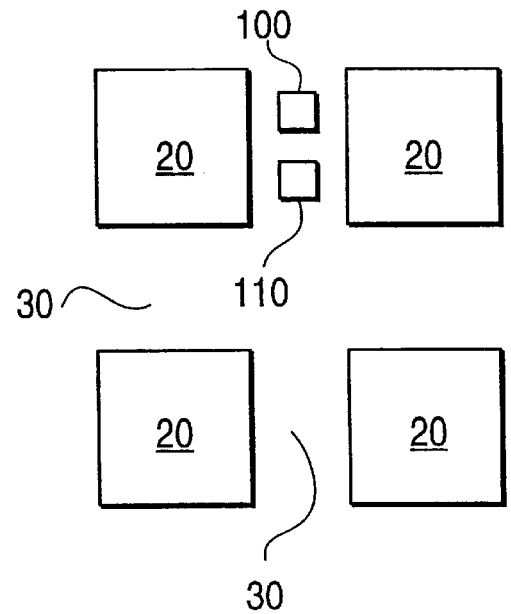
FIG. 6 is an enlarged portion of FIG. 1 showing the placement of chips, scribe line areas and monitor boxes.
Figure 7:
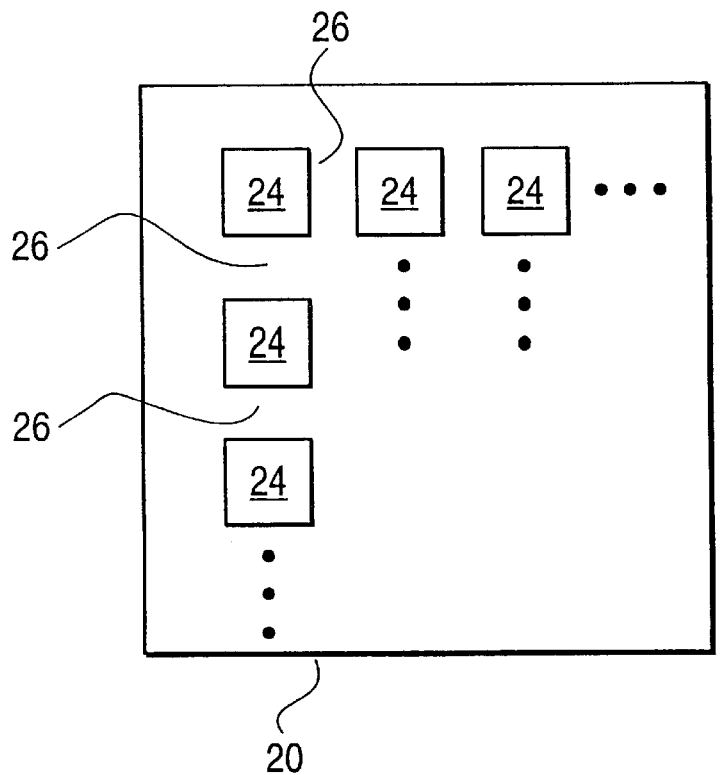
FIG. 7 is an enlarged top view of a chip having core areas and periphery areas.

An example of the locations of the core areas and the periphery areas of a non-volatile memory chip shown in relation to each other can be seen in FIG. 7. As shown, a single chip 20 contains both core areas 24 and periphery areas 26. Of course, in the practice of semiconductor chip fabrication, a plurality of chips are made simultaneously. The relation between multiple chip dies 20 is shown in FIG. 6 which also shows the scribe line area 30 between chips 20. FIG. 5 shows an entire wafer 10 containing many individual chips 20.

Figure 2:
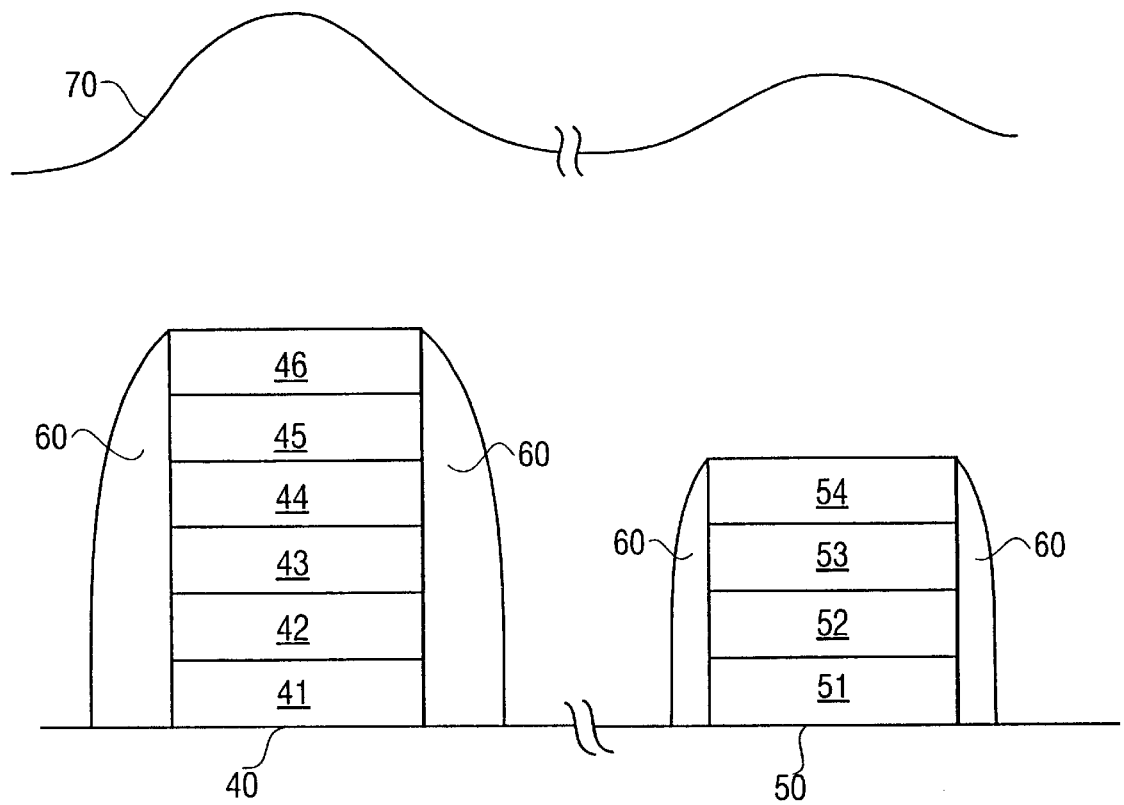
FIG. 2 is a cross sectional view of the chip shown in FIG. 1 after the formation thereupon of a dielectric layer.

Returning to the cross sectional view of the gate structures shown in FIG. 1, after formation of the core and periphery area structures of the non-volatile memory, a dielectric layer, usually an oxide, is formed thereupon. FIG. 2 shows the resulting topography of the chip after formation of the dielectric layer 70. As is evident from FIG. 2, the surface of the dielectric layer 70 is uneven and tends to peak at locations directly above the chip structures.

Figure 3:
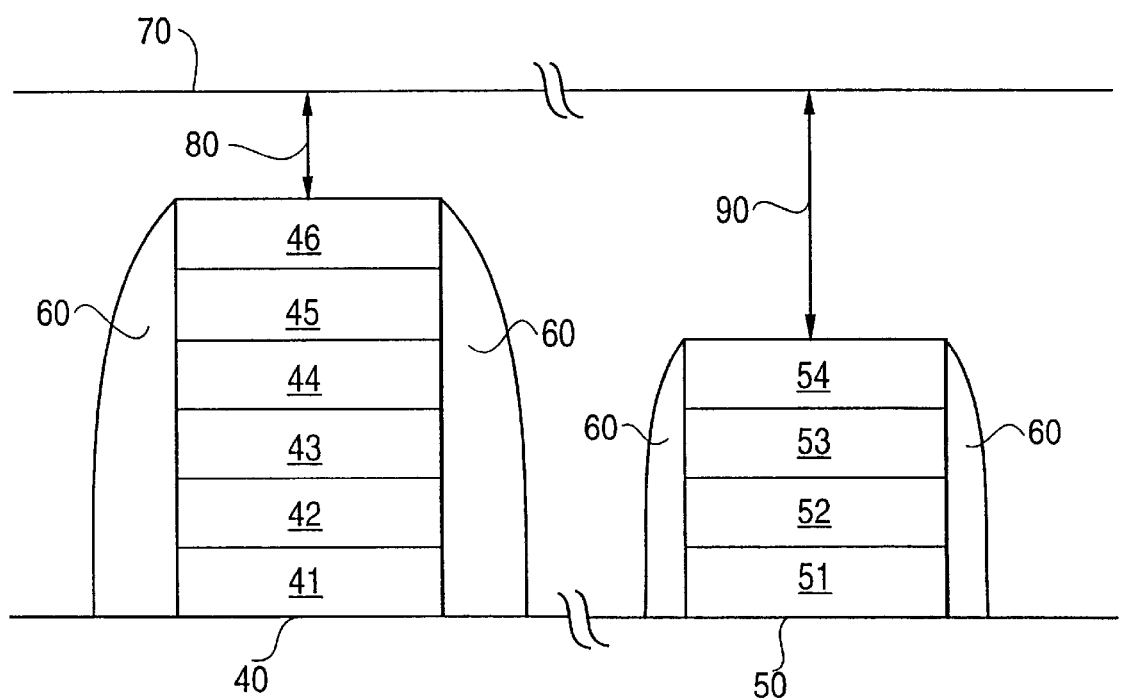
FIG. 3 is a cross sectional view of the chip shown in FIG. 2 after planarization of the dielectric layer.

Chip fabrication process steps, such as photolithography, are made difficult when the surface of a dielectric layer is uneven. This is especially so when an interlevel dielectric layer used, for example, in non-volatile memory chips is uneven. For other reasons as well, besides ease of fabrication, it is desirable that the surface of a dielectric layer be planarized and that the degree of planarization be controlled. To accomplish such planarization of the dielectric layer 70, a process known as chemical-mechanical planarization (CMP) can be used. While the details of the CMP process are beyond the scope of this disclosure, typical CMP processes are disclosed in detail in U.S. Pat. No. 4,944,836 and U.S. Pat. No. 5,084,071. After planarization by CMP, the dielectric is usually cleaned to remove any excess debris. The result of the chemical-mechanical planarization and cleaning is a substantially flattened and smooth dielectric layer 70 as seen in FIG. 3. While the use of chemical-mechanical planarization has been described, it would be apparent to one of ordinary skill in the art that other techniques for planarization exist and could be used instead of CMP.

In addition to controlling the smoothness, or degree of planarization, of the dielectric layer, it is often imperative that the thickness of an interlevel dielectric formed over gate structures also be strictly controlled. The thickness of the dielectric layer above chip components such as gate structures can have direct effect on performance, especially in multi-level chips such as some non-volatile memory chips. If the dielectric layer, after chemical-mechanical planarization, is too thin, the electrical characteristic of the underlying structures is altered. If the layer is too thick, it will adversely affect the successful performance of subsequent process steps, such as contact hole etching. Also, the tolerances defining acceptable dielectric layer thicknesses in complex semiconductor chip fabrication are often very strict.

The measurements that must be made accurately, in this regard, are shown in FIG. 3. The thickness 80 is the thickness of the dielectric layer 70 above a core area gate structure 40. Similarly, the thickness 90 is the thickness of the dielectric layer 70 above a periphery area gate structure 50. These two thicknesses will differ depending on the heights and compositions of the two underlying structures.

Performing a measurement of the actual thickness of the dielectric layer directly over any gate structure is extremely difficult, and often impossible, due in part to the small overall size and limited surface area of the structure and current technological limitations in optical metrology. Measuring a dielectric thickness using known optical metrology means as described herein requires a larger surface area upon which a measurement can be made than is available on gate structures as shown in FIG. 3. For this reason, in the present invention, a plurality of monitor boxes are formed and used. These monitor boxes are formed to simulate actual structures in the chip but have significantly larger surface areas than the actual chip structures and thus better facilitate the accurate measurement of dielectric thickness.

An important aspect of the present invention is that the monitor boxes accurately represent actual structures in the chip. A monitor box of the present invention is formed at the same time as and by using substantially the same process and materials as the structure it represents. By undergoing substantially the same process steps, the monitor box will have substantially the same height as the step height structure it represents. The monitor box will also have the same number of layers and the same materials as the represented structure. As mentioned above, however, the surface area of the monitor box, by design, will be significantly larger than the structure it represents.

While the height and material components of the monitor box is substantially the same as that of the structure it represents, the monitor box need not be identical to the represented structure. It is anticipated that the formation of a structure, such as a gate structure in a non-volatile memory, will involve masking, etching and other steps not affecting the maximum step height of the structure itself. The monitor box representing such a structure need not be subjected to such process steps so long as the maximum height of the monitor box is substantially the same as the step height of the structure itself.

Figure 4:
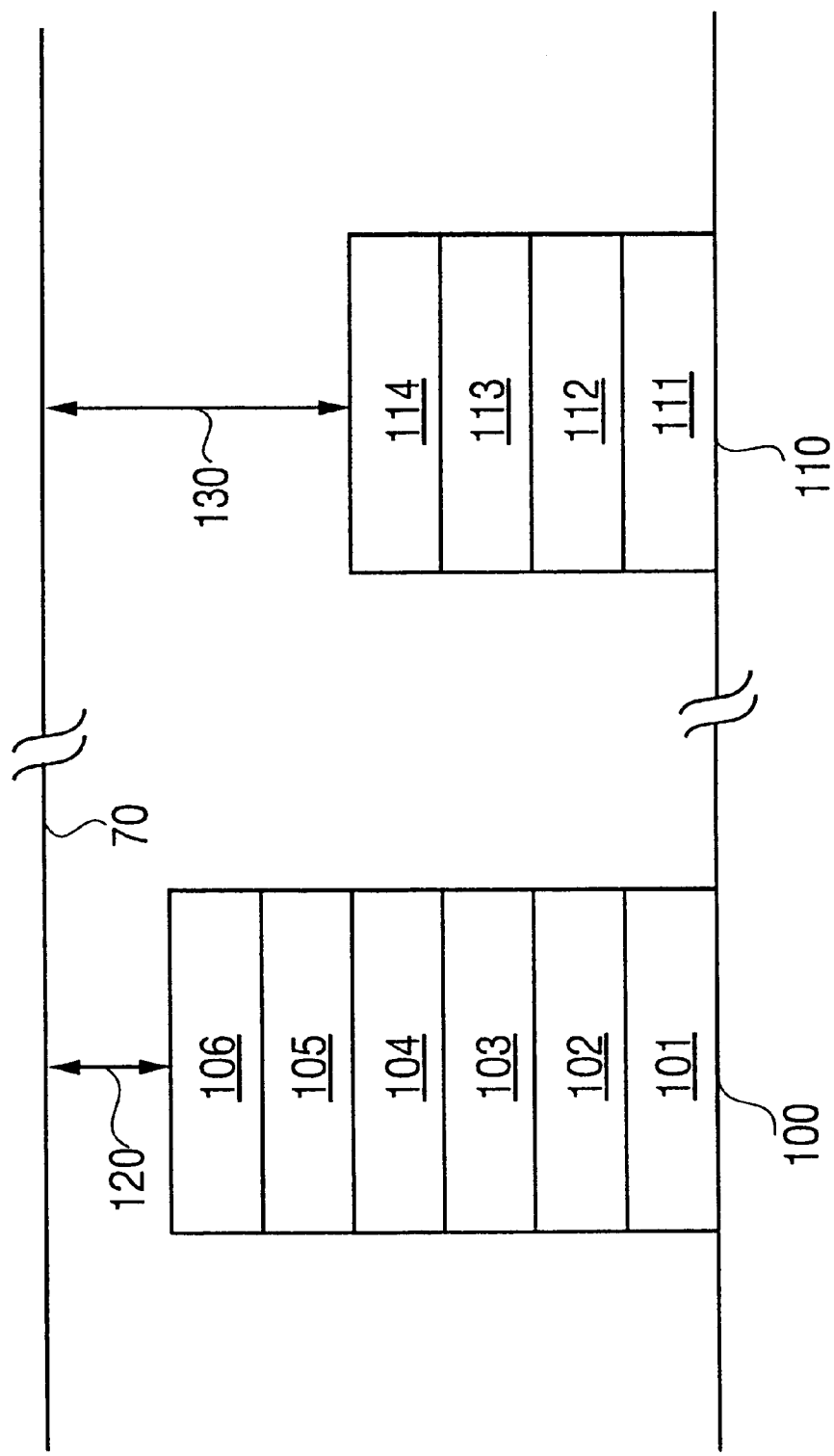
FIG. 4 is a cross sectional view showing the structure of a core area monitor box and a periphery area monitor box for use with the chip shown in FIGS. 1–3.

FIG. 4 shows a cross-sectional view of the monitor boxes of the present invention for use with the non-volatile memory structures as described above. Core area monitor box 100 represents a core area gate structure 40 of FIGS. 1–3. Periphery area monitor box 110 represents a periphery area gate structure 50 of FIGS. 1–3. The horizontal dimensions of the monitor boxes are on the order of 100 microns by 100 microns. As mentioned above these monitor boxes are formed by the same process as the structures they represent and therefore comprise the same number of layers and the same materials as the represented structures. The cross-section of two structures are shown in FIG. 4 for purposes of example and not limitation. It would be apparent to one of ordinary skill in the art that monitor boxes could be formed with different compositions and by using different processes depending upon the chip structure to be represented.

In the case of non-volatile memory structures, as shown in FIG. 4 the core area monitor box 100 comprises the following layers: a tunnel oxide layer 101, a first core polysilicon layer 102 above the tunnel oxide layer 101, an ONO layer 103 above the first polysilicon layer 102, a second core polysilicon layer 104 above the ONO layer 103, a core metal silicide layer 105 above the second polysilicon layer 104 and a core polysilicon cap 106 above the metal silicide layer 105.

The periphery area monitor box comprises the following layers: a gate oxide layer 111, a periphery polysilicon layer 112 above the gate oxide layer 111, a periphery metal silicide layer 113 above the periphery polysilicon layer 112 and a periphery polysilicon cap 114 above the periphery metal silicide layer 113.

After formation of the monitor boxes, a dielectric layer, such as an oxide, is then formed over the monitor boxes and is subsequently planarized as shown in FIG. 4. The planarized dielectric layer 70 is the same dielectric layer as is formed over the gate structures 40 and 50 in FIG. 2 and is subsequently planarized by a process such as CMP as shown in FIG. 3. After planarization by CMP, the dielectric is usually cleaned to remove any excess debris. The thickness 120 is the dielectric layer thickness above the core area monitor box 100 and the thickness 130 is the dielectric layer thickness over the periphery area monitor box 110. These thickness 120 and 130 should be substantially the same as the thickness 80 and 90 as shown in FIG. 3.

Another important aspect to this invention is the use of a plurality of monitor boxes, each representing an actual structure type in the chip. The inventors have found that a single measurement or the use of a single monitor box is imprecise and, in some cases, insufficient to accurately determine whether a dielectric layer is within an acceptable range of thicknesses. This is especially the case with complex semiconductor chips such as the non-volatile memory chips described herein. Due, in part, to the large differences between the structures within these complex chips both in height and composition, the use of a single monitor box representing a single structure type is often inadequate in determining the post-planarization dielectric thickness over all the structures.

In the present invention, as is shown in FIG. 4, a plurality of monitor boxes are formed and used to provide locations from which accurate measurements of dielectric thickness can be made. In the example described herein, a chip with predominantly two different structure types is analyzed and therefore, two distinct monitor boxes are formed. It should be evident to those of ordinary skill in the art that a plurality of any number of monitor boxes can be formed if so desired or if necessitated by the number of structure types in the fabricated chip.

The placement of the plurality of monitor boxes with respect to the chip can be described with reference to FIGS. 6 and 7. For example, FIG. 6 shows the preferred placement of both the core area monitor box 100 and the periphery area monitor box 110 in a scribe line area 30 of the chips. In this embodiment, the monitor boxes are formed directly onto the scribe line area while the represented structures are formed onto the chip. This scribe line area 30 is usually cut away from the chips at the end of the chip fabrication process before the chips are packaged. Therefore, in the embodiment shown in FIG. 6, the monitor boxes are eventually cut away from the resulting chip. Two monitor boxes are shown only for purposes of example and not limitation; the scribe line area 30 could, of course, accommodate placement of more than two monitor boxes. Also, shown is the use of one set of monitor boxes for one chip die or for a pair of chip dies. It should be apparent to one of ordinary skill in the art that greater or fewer sets of monitor boxes can be used instead.

An alternate location for the monitor boxes would be in proximity to the structures they represent. For example, a core area monitor box 100 could be placed in or in proximity to a core area of a chip. Similarly, the periphery area monitor box 110 could be placed in the actual periphery area of the chip. FIG. 7 shows the relation between the core areas 24 and the periphery areas 26 of a chip. Such placement of monitor boxes would require chip design such that functionality is unaffected by the monitor boxes. An advantage to such placement is increased accuracy in the determination of the dielectric layer thickness over the actual chips.

Next it will be described how measurements are made upon the monitor boxes and how dielectric layer thicknesses are calculated therefrom. After the deposit of an interlevel dielectric, measurements are made on the monitor boxes both before and after the chip is subjected to the CMP process and cleaning. The dielectric thickness in each instance can be determined using known optical metrology means. The metrology tool used by the inventors is the OptiProbe 1600 manufactured by Thermawave which utilizes a technique known as Beam Profile Reflectometry. This technique performs a measure of reflected intensity as a function of the angle of incidence of the light on the chip. Specifically, the dielectric layer over the monitor box surface is irradiated with light, preferably laser light. Light is partially absorbed by the dielectric and reflected from the surface of the dielectric as well as from the surface of the monitor box through the dielectric layer. Both types of reflected light are collected and their intensities measured. These measurements comprise what is defined as the reflectance of the dielectric layer. By performing a calculation based upon the intensities of the incident and of the reflected light, the angle of incidence of the light and the dielectric constant for the measured dielectric layer, the dielectric layer thickness is determined. Thickness measurements are often made both before and after CMP processing and cleaning so that the amount of dielectric removed thereby can be easily determined. Knowledge of the amount of dielectric removed is important to establish whether sufficient planarization of the dielectric layer has occurred.

Referring to FIG. 4, by using a measurement technique similar to that as described above, the thicknesses 120 and 130 of the dielectric layer 70 can be measured accurately. By verifying that the resulting thickness of the dielectric layer is within an acceptable range over the monitor boxes representing a plurality of types of structures, a determination for acceptability can be made for each chip within the wafer. However, it is generally unnecessary to make a determination on a chip by chip basis. In the preferred embodiment, the measurements, as described above, are made over a sampling of the monitor boxes within a wafer and then averaged to determine acceptability for an entire wafer.

It is intended that the invention, as described herein, include all variations and modifications as fall within the scope of the claims and equivalents thereof.

What is claimed is:

1. A method of measuring the thickness of a dielectric layer above a plurality of structures of differing types within a semiconductor chip comprising the steps of:

forming a plurality of monitor boxes on a semiconductor chip such that each of said plurality of monitor boxes represents one of said differing structure types within the semiconductor chip and has substantially the same step height as the structure type it represents;

forming a dielectric layer over the semiconductor chip; and measuring a thickness of the dielectric layer above at least one of said plurality of monitor boxes, wherein said thickness represents a thickness of the dielectric layer above a structure of the structure type represented by the monitor box.

2. A method according to claim 1 wherein the step of forming a plurality of monitor boxes further comprises forming each of said plurality of monitor boxes by using substantially the same process as used in forming the structure type represented by the monitor box.

3. A method according to claim 2 wherein the step of forming a dielectric layer further comprises the step of performing chemical-mechanical planarization of the dielectric layer.

4. A method according to claim 3 further comprising the step of locating at least one of said plurality of monitor boxes in a scribe line area of the semiconductor chip.

5. A method according to claim 3 further comprising the step of locating at least one of said plurality of monitor boxes in proximity to a structure of the structure type represented by the monitor box.

6. A method of accurately measuring the thickness of a dielectric layer above a plurality of structures within a semiconductor chip comprising the steps of:

forming a plurality of monitor boxes on a semiconductor chip such that each of the monitor boxes is formed using substantially the same process as and has substantially the same step height as a structure of a structure type represented by the monitor box;

locating at least one of said plurality of monitor boxes in proximity to a structure of the structure type it represents;

forming a dielectric layer over the semiconductor chip;

planarizing the dielectric layer;

obtaining a measurement on the selected one or more of the plurality of monitor boxes of the reflectance of the dielectric layer remaining after chemical-mechanical planarization; and calculating the thickness of the dielectric layer above the selected one or more of the plurality of monitor boxes, wherein said thickness represents a thickness of the dielectric layer above a structure of the structure type represented by the selected one or more of the plurality of monitor boxes.

7. A method according to claim 6 wherein the step of planarizing the dielectric layer further comprises the step of performing chemical-mechanical planarization of the dielectric layer.

* * * * *